(12) United States Patent
Salles

(10) Patent No.: US 8,760,873 B2
(45) Date of Patent: Jun. 24, 2014

(54) MODULAR ASSEMBLY FOR FASTENING ELECTRONIC MODULES

(75) Inventor: Pierre Salles, La Salvetat Saint Gilles (FR)

(73) Assignee: AIRBUS Operations S.A.S., Toulouse (FR)

( * ) Notice: Subject to any disclaimer, the term of this patent is extended or adjusted under 35 U.S.C. 154(b) by 380 days.

(21) Appl. No.: 13/085,969

(22) Filed: Apr. 13, 2011

(65) Prior Publication Data

US 2011/0249399 A1 Oct. 13, 2011

(30) Foreign Application Priority Data

Apr. 13, 2010 (FR) ..................................... 10 52795

(51) Int. Cl.
*H05K 5/00* (2006.01)
(52) U.S. Cl.
USPC ........... 361/730; 361/756; 361/796; 361/831; 174/520; 439/62
(58) Field of Classification Search
USPC .............. 361/676, 679.46–679.54, 688–722, 361/727–733, 752, 756, 796, 831
See application file for complete search history.

(56) References Cited

U.S. PATENT DOCUMENTS

| | | | | |
|---|---|---|---|---|
| 5,148,353 | A * | 9/1992 | Morgan et al. ................ | 361/726 |
| 5,497,288 | A * | 3/1996 | Otis et al. ................. | 361/679.46 |
| 6,393,853 | B1 * | 5/2002 | Vukovic et al. .............. | 62/259.2 |
| 6,693,797 | B2 * | 2/2004 | Faneuf et al. ................ | 361/689 |
| 7,212,409 | B1 * | 5/2007 | Belady et al. ................ | 361/721 |
| 7,372,702 | B2 * | 5/2008 | Gauche et al. ............... | 361/719 |
| 7,997,918 | B2 * | 8/2011 | Canfield et al. .............. | 439/310 |
| 8,000,096 | B2 * | 8/2011 | Nemoz et al. ............ | 361/679.32 |
| 2004/0050569 | A1 | 3/2004 | Leyda et al. | |
| 2009/0260777 | A1 * | 10/2009 | Attlesey ......................... | 165/67 |
| 2011/0013364 | A1 * | 1/2011 | Howes et al. ................ | 361/700 |
| 2011/0051342 | A1 * | 3/2011 | Crippen et al. ............ | 361/679.4 |

FOREIGN PATENT DOCUMENTS

| | | |
|---|---|---|
| EP | 1 958 490 | 8/2008 |
| WO | WO 2010/046376 A1 | 4/2010 |

OTHER PUBLICATIONS

French Preliminary Search Report issued Nov. 29, 2010, in French 1052795, filed Apr. 13, 2010 (with English Translation of Categories of Cited Documents).

* cited by examiner

*Primary Examiner* — Courtney Smith
(74) *Attorney, Agent, or Firm* — Oblon, Spivak, McClelland, Maier & Neustadt, L.L.P.

(57) ABSTRACT

The invention relates to a modular assembly for fastening electronic modules carried on board an aircraft, characterized in that it comprises:
  a frame (10) having a more or less planar vertical front surface, comprising several mechanical fastening interfaces each intended for mechanically fastening an electronic module,
  at least one electronic module (80) comprising a mechanical fastening interface and which is attached to the front surface of the frame in suspended position via cooperation of the mechanical fastening interface of the said at least one electronic module with one of the mechanical fastening interfaces of the frame.

16 Claims, 7 Drawing Sheets

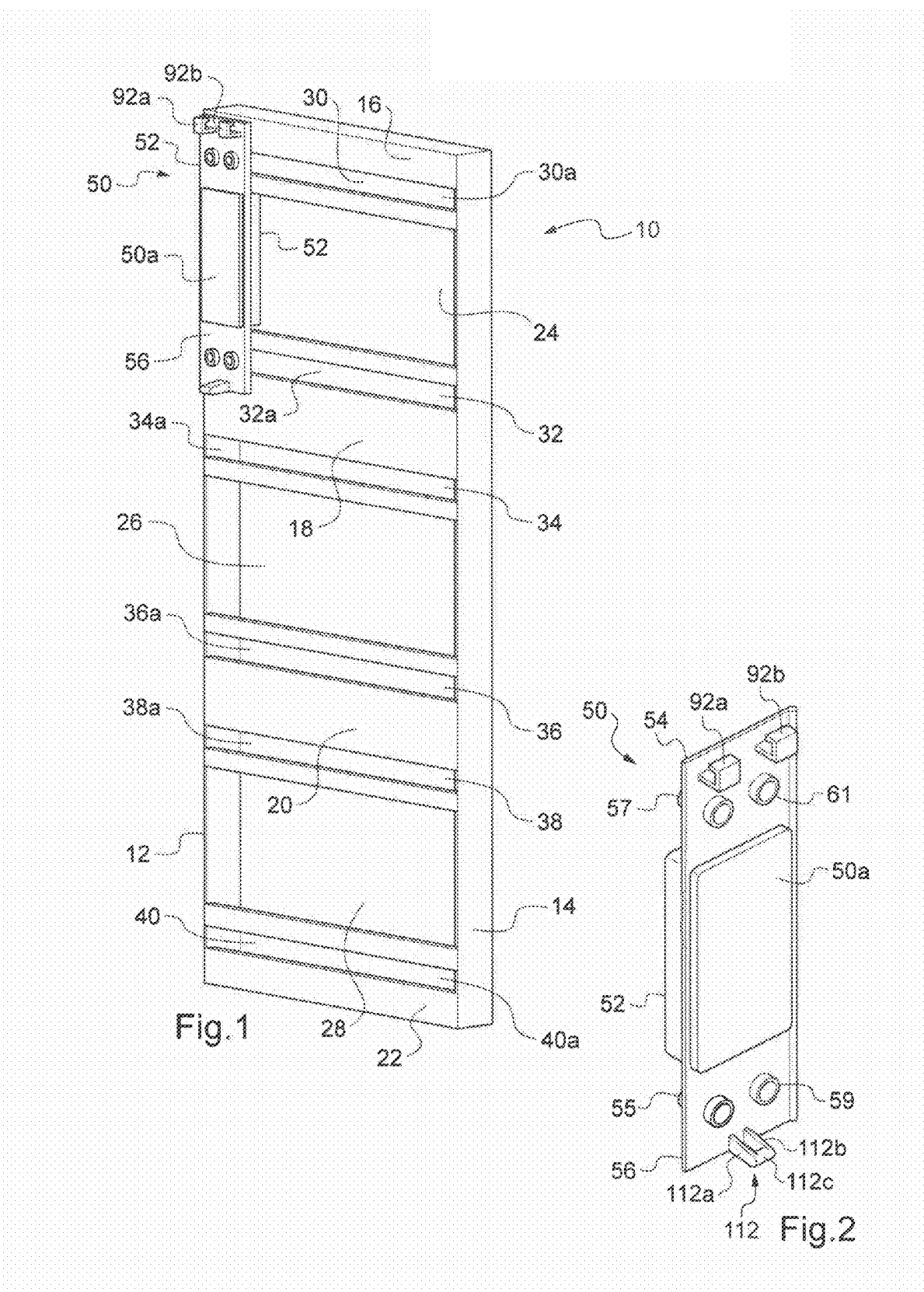

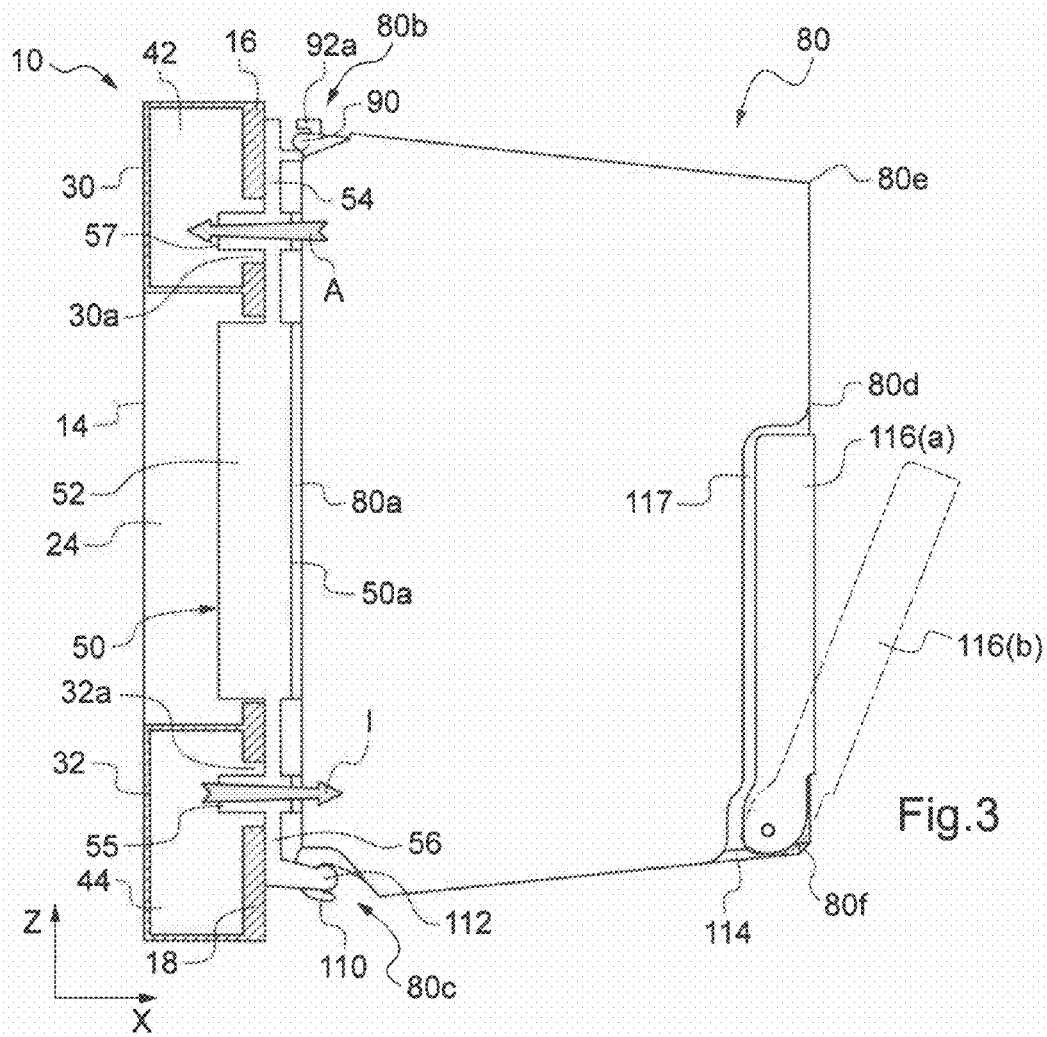
Fig.3
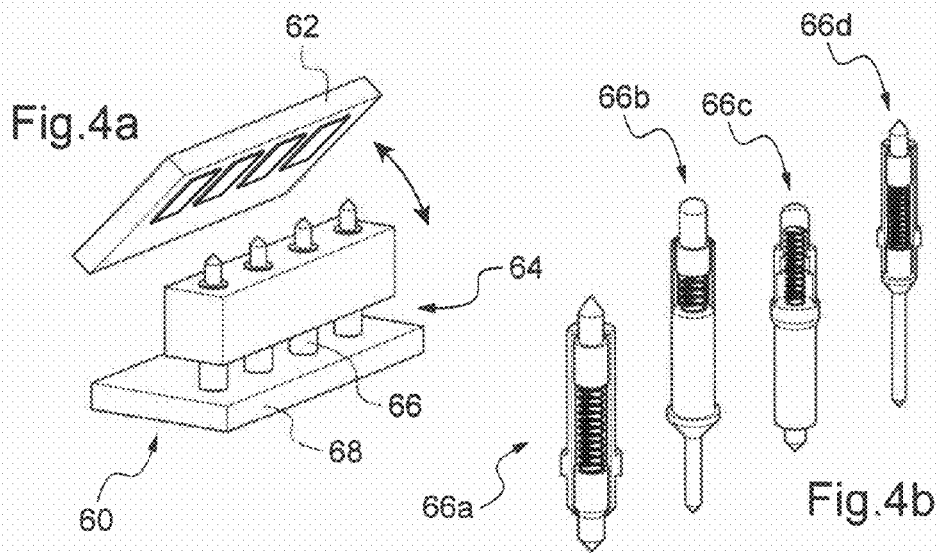
Fig.4a
Fig.4b

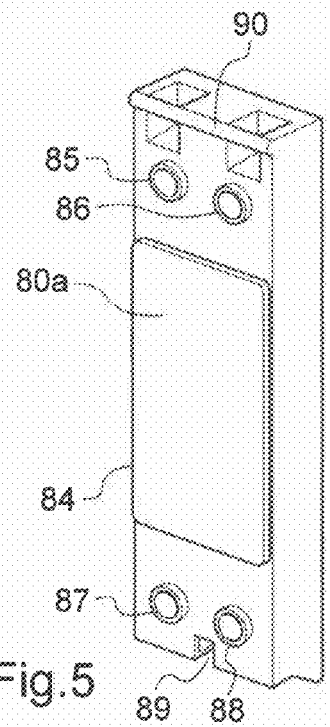
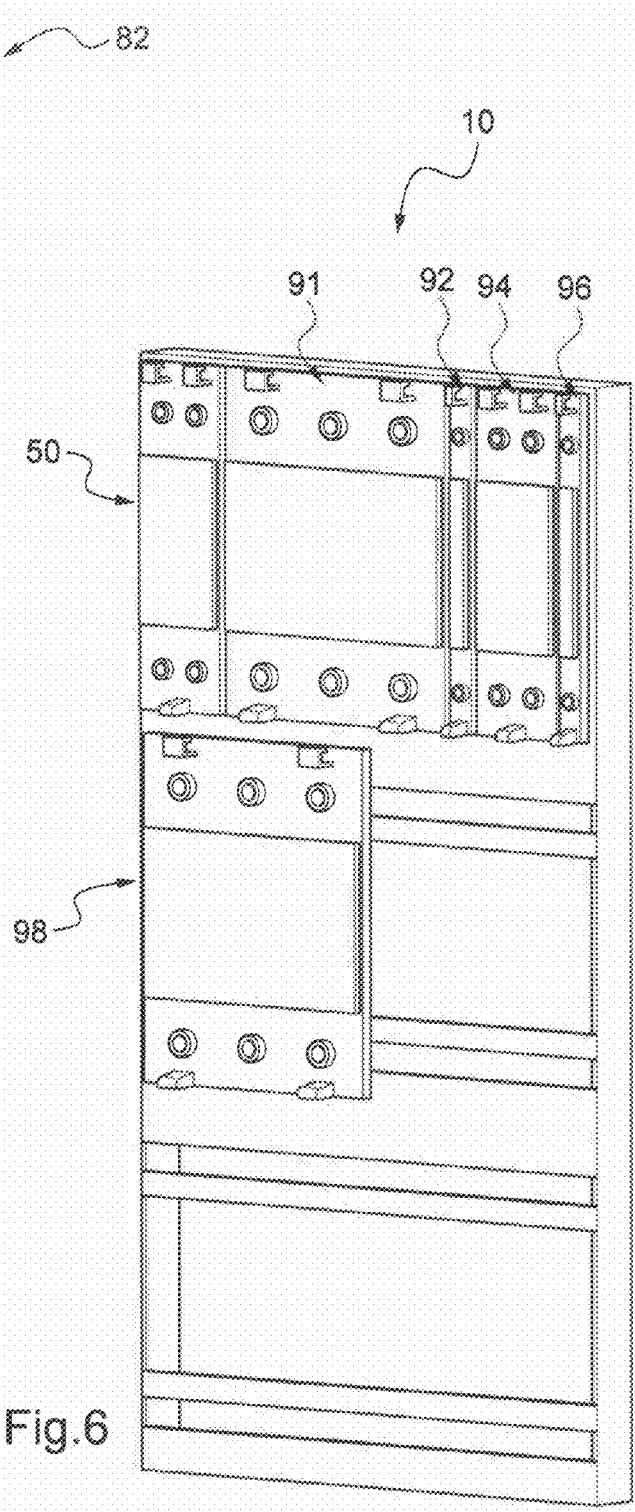

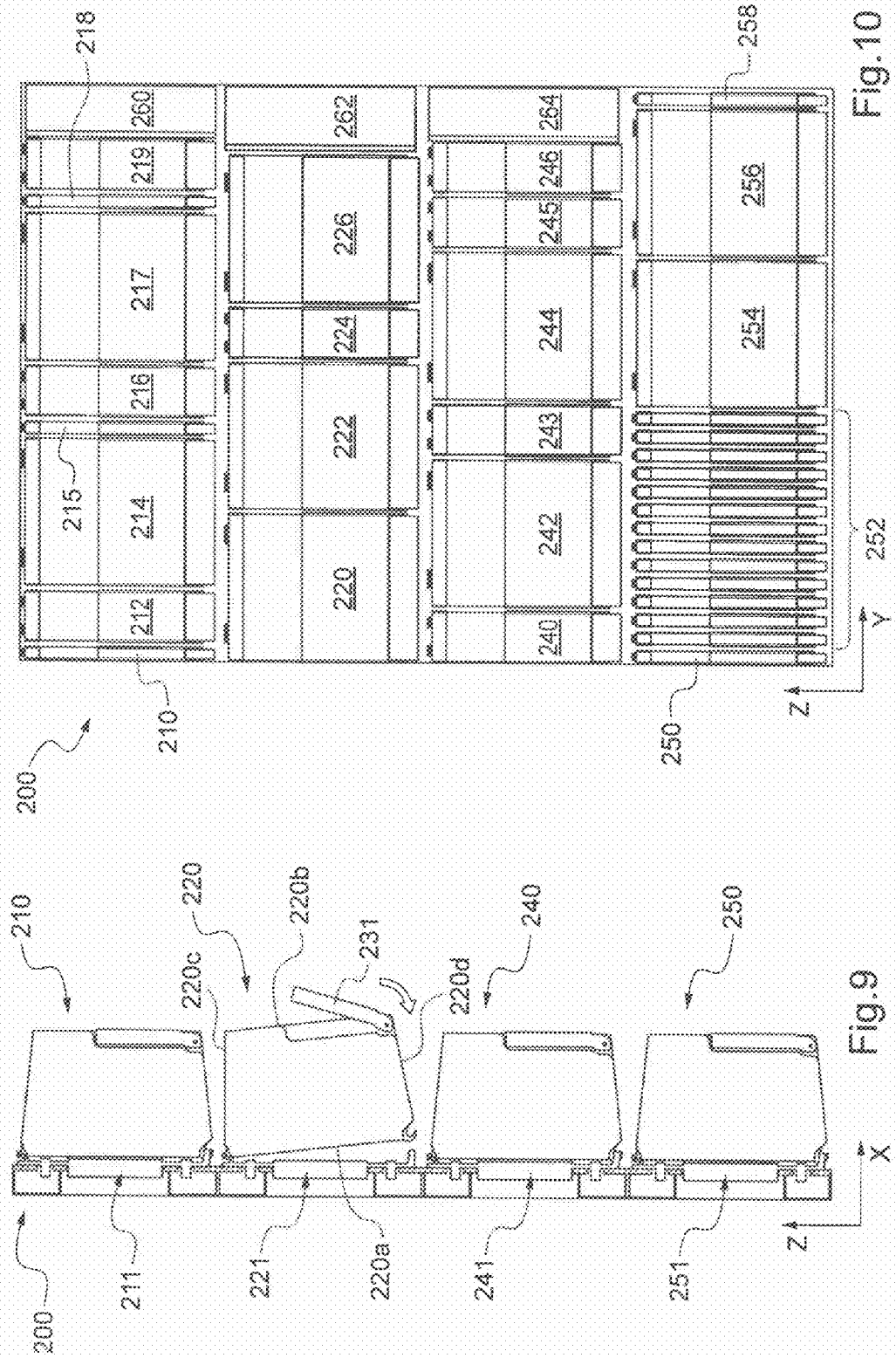

MODULAR ASSEMBLY FOR FASTENING ELECTRONIC MODULES

TECHNICAL FIELD

This invention relates to a modular assembly for the mechanical fastening of electronic modules.

BACKGROUND

In an aircraft, many electronic equipment items are located in a zone situated underneath the cockpit of the aircraft, which provides the equipment items with preferential environmental conditions such as a reasonable ambient pressure and a controlled ambient temperature. Units are disposed in this zone and make it possible to fasten equipment items, connect them to the cables of the aircraft and ventilate them.

The document US2004050569 describes and shows a known connection assembly, in which at least one electronic equipment item is disposed in a support means. This support means comprises a movable carrier structure in the general shape of a chair having a horizontal support, a vertical back element and two side jambs, this structure defining a housing for accommodating an electronic equipment item. The carrier structure comprises a connection interface at the back element and on which the electronic equipment item comes to be connected horizontally. The assembly created in this way is brought into the desired zone, next to other assemblies created separately, and the wiring of the aircraft is added onto each connection interface integral with an electronic equipment item.

Such an assembly is defined in particular by the international aeronautical standard ARINC 600.

This type of assembly, however, could be improved in keeping with more modular future solutions.

In this regard, the invention proposes a new modular assembly for fastening electronic module(s)/equipment item (s).

SUMMARY

More particularly, the invention has as an object a modular assembly for fastening electronic modules carried on board an aircraft, characterized in that it comprises:
- a frame having a vertical front surface more or less planar, comprising several mechanical fastening interfaces each intended for mechanically fastening an electronic module,
- at least one electronic module comprising a mechanical fastening interface and which is attached to the front surface of the frame in suspended position through cooperation of the mechanical fastening interface of the said at least one electronic module with one of the mechanical fastening interfaces of the frame.

This assembly is modular in the sense that it may accommodate on the frame several electronic modules of different widths. The width of a module corresponds to a horizontal dimension parallel to the vertical front surface when the frame is installed vertically and the module is suspended. In particular, the frame may have a variable width or comprise a non-planar part.

In particular, the mechanical connection interfaces may be situated at the back of the electronic module or on the sides thereof. Other configurations also may be considered.

The assembly according to the invention is of simpler design than the known assemblies of the prior art.

The attachment of a module to a vertical surface of the frame by suspending it therefrom makes it possible to reduce the overall space requirement of the assembly.

In fact, the module is brought against the front surface above the attachment position, then is lowered until the attachment system of the module engages with one of the attachment systems of the frame and the module is retained by the latter in suspended position.

It therefore no longer is necessary, at least in certain cases, to have the use of the total length or depth of the module in front of the fastening and connection assembly in order to be able to install the module in position on the frame and remove it therefrom.

Furthermore, the fact that the module is suspended from a frame is advantageous inasmuch as the mass of the module is a fastening aid. In fact, the weight of the module has a tendency to bring the latter closer to the front surface of the frame and, for example, to press it against same as soon as it is engaged in one of the means for attachment by suspension. This ease of attaching the module is advantageous in confined spaces of the aircraft. Moreover, the structure for accommodating the modules consists of the frame which occupies less space in thickness or depth than the units of the prior art even in the absence of modules.

In addition, when the modules are suspended from the frame they are not separated from each other by side partitions which may reduce the space available for accommodating the modules.

When the modules are suspended, there no longer are upper or lower partitions.

In this way, the modules are not confined, which favors thermal exchanges with the ambient air.

It will be noted that the modular assembly briefly described above applies just as well to electronic modules that are electrically autonomous as to electronic modules that are not.

According to one characteristic, the frame comprises several electrical connection interfaces each intended for establishing an electrical connection with an electronic module, the said at least one electronic module which is attached to the front surface of the frame in suspended position comprising an electrical interface cooperating with one of the electrical connection interfaces of the frame in order to establish an electrical connection.

The system for attaching a module by suspension makes it possible to benefit from the weight of the latter. In this way, the weight of the module tends to press the latter against the front surface of the frame and in particular against the electrical connection interface, thus favoring the establishment of the electrical connection.

As soon as a module is suspended from the frame and in contact with the front surface thereof, the respective electrical connection interfaces arranged along the front surface are in mechanical and electrical contact with each other.

The electrical connection interface of the frame is connected, for example, to the wiring of the installation and particularly to the wiring of an aircraft in which the assembly may be set up.

It will be noted that when the electrical connection interface is a piston connection type interface, it constitutes a "natural" aid in disconnection of the modules.

In fact, when the module is moved away from the front surface of the frame and therefore from the connection interface of the frame, the springs of the piston contacts also contribute to this space and, therefore, to the disengagement of the module.

The aforesaid advantages are particularly attractive when the assembly is set up in an aircraft.

According to one characteristic, the module has a dimension which extends between two opposite ends and which is disposed vertically when the module is attached to the frame, the module being attached to the front surface of the frame near the upper end.

According to one characteristic, the assembly comprises means for locking the module in suspended position.

Locking the modules on the frame offers an additional security and also provides an additional fastening.

More particularly, the locking means (locking mechanism) are disposed in part on the frame and in part on the module and cooperate via an engagement of the locking means of the module with the complementary means of the frame.

According to one characteristic, the locking means of the module comprise a part secured to the module near the opposite lower end.

The module thus is brought along the front surface of the frame above the provided attachment position and is lowered so as to engage the attachment system of the upper end with the complementary attachment system of the front surface of the frame. Then, when locking means are disposed near the lower end of the module, they are engaged with the complementary locking means of the front surface of the frame.

The module then is fastened by at least two anchoring points at the top and at the bottom, against the front surface of the frame, thus preventing the module from moving away from the frame in case of movements of the vehicle (example: aircraft) transporting the assembly or of vibrations transmitted to the assembly.

Such a space actually could affect the module-frame electrical connections.

According to one characteristic, an actuation component connected to the locking means is provided on the module and may be actuated between a locked position in which the component is disposed against the module and an unlocked position in which the component is moved away from the module.

This safety component serves, for example, as a visual signal. When the component is in position moved away from the module, it may be seen by an observer who then concludes therefrom that the module is not fastened in locked manner on the frame. It will be noted that the moved-away position is defined according to a view in a plane perpendicular to the front surface of the frame.

According to one characteristic, the module is attached to the front surface of the frame via an attachment system forming an articulated connection.

This attachment system ensures a guidance function for the module during the phase of attachment and particularly of articulation in relation to the frame.

In this way the module is articulated in relation to the frame for example by a hinge-type connection.

When the locking means (optional) are not engaged, the module thus may be moved away from the frame by pivoting around its hinge connection with the said frame.

The installation of the module thus is accomplished, for example, by bringing the module into tilted (pivoted) position in relation to the frame in order to engage via the top the attachment system of the module on the complementary attachment system of the frame, then pivoting the module around the hinge connection bringing it into contact with the front surface of the frame.

It will be noted that the system for attachment by articulated connection alternatively may be arranged at the lower part of the module.

The system for attachment by articulated connection comprises, for example, a pivot/hook system, the hook(s) being able to be on the module and the pivot(s) on the frame or vice versa.

It is conceivable, for example, to place the pivot on the module in order to avoid handling an equipment item with an "aggressive" shape for reasons of safety of persons.

Other attachment/guidance systems are conceivable, such as sliding systems. Sliding could take place parallel to the front surface of the frame to perpendicular thereto over a short distance (for example via rails a few centimeters in length).

An attachment system combining an articulated connection and a sliding perpendicular to the front surface of the frame could be used with an electrical connection interface requiring the fitting together of male and female electrical contacts.

According to one characteristic, the assembly comprises an air-conditioning or heat-management system for the electronic module.

This system linked to the frame is intended, for example, to cool the module, on command, when same is attached to the frame.

According to one characteristic, the air-conditioning system comprises, fastened to the frame, a unit for injection of a fluid (for example a coolant) into the module and a unit for suction of the fluid having been injected into the module and/or an opening in the module for evacuation of the injected fluid. The module comprises a complementary interface for cooperating with at least the injection unit.

The opening or openings for evacuation of fluid (air) may be arranged on the top of the module and/or on the face in contact with the front surface of the frame.

The air-conditioning system here provides, for example, a cooling function.

In the modular assembly according to the invention, the electronic modules may be closer to each other laterally than in the prior art. In fact, the system for insertion/extraction of the modules is simplified as a result of the method of attachment via one or more suspension points and therefore requires less space for insertion and extraction of the modules.

Moreover, module-by-module heat management also makes it possible to effectively air-condition each module internally. The modules therefore do not need to be moved away from each other in order to exchange thermally with the ambient air of the zone and to avoid thermal coupling between modules.

The installation of the module on the frame at the appropriate location makes it possible to connect the injection and suction units of the frame with the respective complementary interfaces of the module. The frame comprises, for example, several boxes or channels in the thickness of the frame and inside of which the coolant that is brought to the modules and the fluid that is evacuated from the modules circulate.

It will be noted that the air-conditioning system comprises, in addition to the boxes/channels, a cooling interface which is disposed between the boxes/channels and the complementary interface of the module.

More particularly, the air-conditioning interface comprises one or more orifices/ducts for conduction or evacuation (according to the type of interface) of fluid, and the attached module comprises orifices situated facing each other and which are fastened imperviously to the corresponding orifices/ducts of the interface (for example by fitting of one duct into the other and also using a seal) to allow internal fluid circulation.

It will be noted that the length of the conduction and evacuation ducts (perpendicular to the front surface of the frame) may be adjusted to serve as guidance for a module during a sliding phase which takes place over a short distance and which is provided for attachment of the module.

According to one characteristic, the frame comprises a block for interfacing with the said at least one module which has the more or less planar vertical front surface, the module being attached to the vertical front surface of the interfacing block of the frame.

According to one characteristic, the interfacing block comprises an electrical connection interface.

This interfacing block thus is fastened beforehand to the structure of the frame and comprises the mechanical connection interface (attachment system) and possibly the electrical connection interface and the air-conditioning (example: cooling) interface of the air-conditioning system when such a system is provided.

The frame thus may be produced a minima in a basic version with horizontal and vertical jambs spaced apart from each other. Interfacing blocks each intended to interface mechanically and possibly electrically with an electronic module are added in modular manner onto the frame according to the modules to be accommodated.

Each block thus has a width that depends on that of the module to be accommodated.

It will be noted that a sufficiently wide interfacing block makes it possible to attach more than one electronic module.

According to one characteristic, the frame comprises a plurality of horizontal support elements disposed one above the other in parallel and spaced-apart manner, the interfacing block being fastened onto two consecutive support elements.

In this way each interfacing clock is disposed in the space made between two consecutive horizontal support elements and between the two vertical support elements which close off the structure and define its thickness.

Each block is arranged so as to have a greater thickness in its central part than close to two opposite edges flanking same and which are thinned down, thus making it possible to accommodate this thick central part in the clear space indicated above.

The affixing of interfacing blocks on the frame therefore adds only very little thickness to the frame, thus offering a relatively small space requirement.

It will be noted that the central part of each block accommodates, for example, the electrical connection interface of the block.

According to one characteristic, the assembly comprises a plurality of module attachment systems that are arranged, on the one hand, horizontally in order to be able to suspend several modules one beside the other according to a horizontal layout forming a row and, on the other hand, at different vertical heights so as to be able to suspend several rows of modules one above the other.

The frame of the assembly according to the invention thus may accommodate several rows of electronic modules one disposed above the other.

The space left clear at the top between two consecutive rows should be sufficient for being able to install and remove a module without needing to remove the top module or modules but should not be excessively large so as not to considerably increase the space requirement of the assembly (in particular its height).

In this regard, it will be noted that the shape of the modules also may contribute to facilitating installation and removal of the modules.

Thus, for example, each module has a general shape widened at its part in contact with the frame and narrower at its opposite part according to a direction perpendicular to the front surface of the frame.

The invention also has as an object a fastening frame for an aircraft, characterized in that it comprises:
a more or less planar front surface,
several mechanical fastening interfaces on the front surface, each intended for attachment, in suspended position, of an electronic module carried on board the aircraft.

Such a frame has the same advantages as those described above.

It may be installed in cramped places (sites . . . ) where access is difficult for handling electronic modules.

It may be installed, for example, in an aircraft and more particularly in the avionic bay situated under the cockpit.

According to other characteristics of the frame, taken individually or in combination:
the frame comprises an air-conditioning system for the electronic module comprising a unit for injection of a fluid intended to inject a fluid (for example coolant) into the module and possibly a unit for suction of the fluid intended to suck up the fluid having been injected into the module and having cooled it, for example;
the frame comprises several electrical connection interfaces each intended for establishing an electrical connection with an electronic module;
the frame comprises locking means associated with the frame and which are intended to lock the module in suspended position.

The invention also has as an object an electronic module intended to cooperate with the frame briefly described above.

This module of a new type comprises individually or in combination:
a mechanical fastening interface (attachment system) complementary to that of the frame so as to be able to be attached in suspended position to the front surface of the said frame;
an electrical connection interface intended to cooperate with one of the electrical connection interfaces of the frame in order to establish an electrical connection.

The module has the same advantages as those already described above.

According to other characteristics of the module taken individually or in combination:
the module comprises an air-conditioning interface complementary to the air-conditioning system of the aforesaid frame and which is intended to cooperate with at least the injection unit of the said cooling system (it will be noted that the module may comprise one or more openings for evacuation of the injected fluid);
the module comprises locking means for the module which are complementary to the locking means associated with the aforesaid frame and which are intended to lock the module in suspended position on the frame.

Furthermore, an actuation component (example: handle) connected to the locking means is provided on the module and may be actuated between a locked position in which the component is disposed against the module and an unlocked position in which the component is moved away from the module.

According to another aspect, the invention applies to an aircraft which comprises one or more modular fastening assemblies such as briefly described above.

According to yet another aspect, the invention applies to an aircraft which comprises one or more fastening frames such as briefly described above. This or these frames serve to accommodate the electronic modules equipped with fastening means and complementary means.

BRIEF DESCRIPTION OF THE DRAWINGS

Other characteristics and advantages will become apparent in the course of the description that is going to follow, provided solely by way of non limitative example and presented with reference to the attached drawings, on which:

FIG. 1 is a general schematic view in perspective of a frame according to the invention comprising an interfacing block;

FIG. 2 is a general schematic view in perspective of an interfacing block intended to be fastened to the frame such as shown on FIG. 1;

FIG. 3 shows a schematic view in cross section of a frame equipped with an electronic module according to the invention via an interfacing block;

FIGS. 4a and 4b schematically illustrate different electrical interface elements intended for establishing an electrical connection between the frame and an electronic module;

FIG. 5 schematically illustrates an interfacing block of the module;

FIG. 6 is a schematic view in perspective similar to that of FIG. 1 and on which several interfacing blocks have been shown on the frame;

FIG. 9 is a schematic view in cross section of a modular assembly according to the invention;

FIG. 10 is a schematic front view of the assembly of FIG. 9;

DETAILED DESCRIPTION

Figure 7:
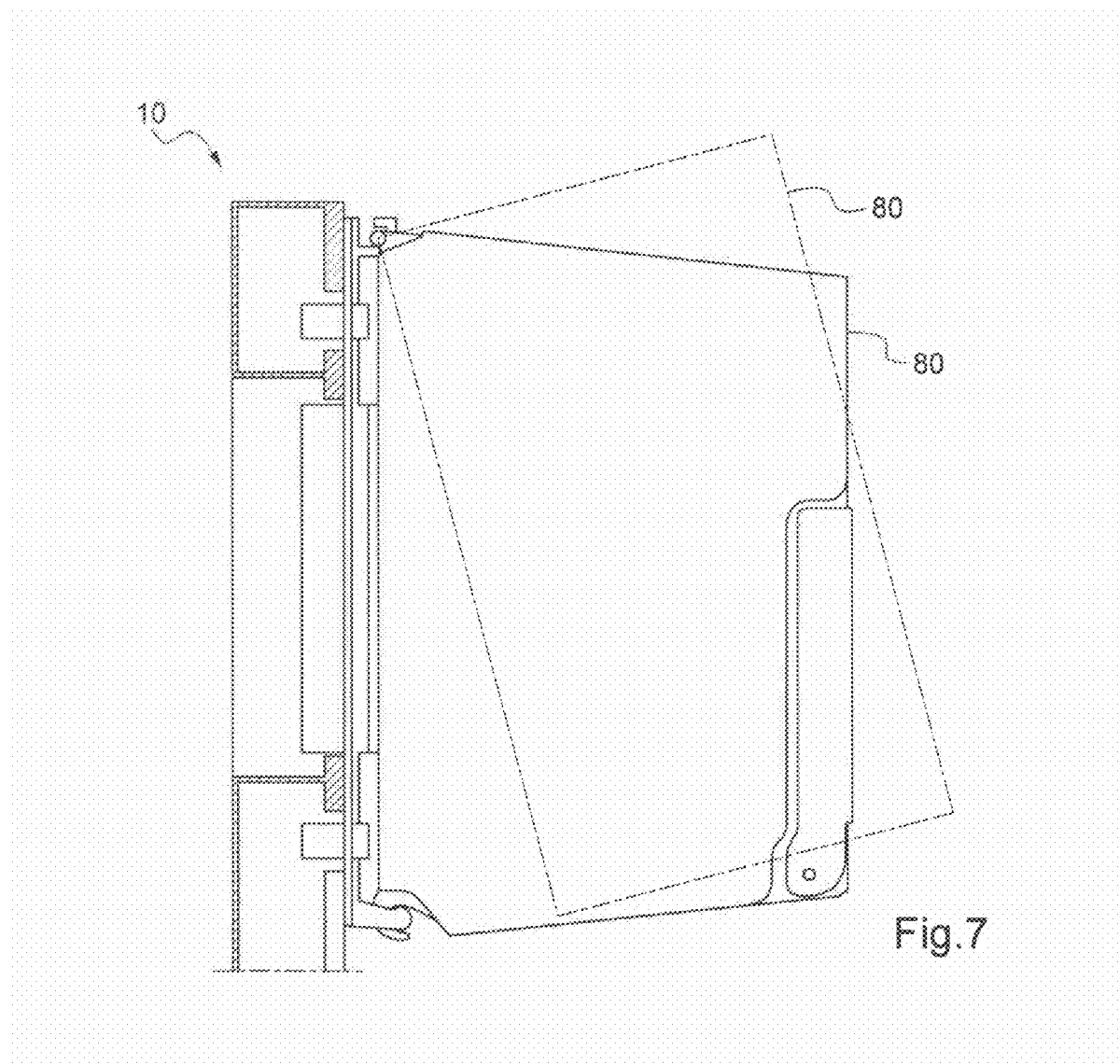
FIG. 7 schematically illustrates the installation of an electronic module on a frame according to the invention.

As shown on FIG. 1 and designated by the general reference marked 10, a frame for fastening and electrical connection of electronic modules or equipment items comprises a structure made up of several longitudinal and transverse uprights.

This frame is disposed vertically for its use.

Frame 10 comprises, for example, two longitudinal jambs 12, 14, connected perpendicular to one another by a plurality of jambs or transverse support elements 16, 18, 20 and 22 parallel to each other and moved away from each other so as to make a clear space 24, 26 and 28 between two consecutive elements.

Longitudinal jambs 12 and 14 which, in the arrangement of FIG. 1, are shown in vertical position, are provided with a certain thickness which defines the total thickness of frame 10. This thickness here is constant but may vary, just as for the transverse jambs. Alternatively, the longitudinal or transverse jambs may comprise a non-planar part.

The space left clear 24, 26 and 28 between two consecutive transverse jambs extends along the entire thickness of the frame and along a longitudinal dimension or height corresponding to the distance between the consecutive transverse jambs.

This space is very useful as will be seen subsequently, since it defines an accommodation inside of which the various elements according to the invention are going to be arranged, allowing the available space to be used as efficiently as possible.

As shown on FIG. 1 and in greater detail on FIG. 3, frame 10 comprises several hollow transverse boxes 30, 32, 34, 36, 38 and 40 each arranged behind the transverse jambs, so as to form inside a channel for circulation of a coolant.

FIG. 3 illustrates upper box 30 and lower box 32 inside of which fluid-circulation channels 42 and 44 are created.

It will be noted that each box is connected to a duct and to a fluid evacuation (not shown on the Figures).

The thickness of the boxes is, for example, equal to the thickness or the depth of longitudinal jambs 12 and 14 and, in this way, the thickness of the frame is defined by the depth of the boxes (dimension measured along the X axis) and the thickness of the transverse jambs.

The structure of the frame is proportioned to support the weight of a plurality of electronic modules that are going to be suspended there.

As shown on the Figures, frame 10 represents a structure or armature made up of a small number of elements/parts which are judiciously arranged in relation to each other so as to be able to accommodate elements of equipment items of the frame according to the invention.

The small number of elements/parts making up the frame imparts a relatively small mass, which is advantageous in terms of mass carried on board an aircraft.

The structure of the frame is, for example, made of an aluminum alloy, or even a composite material (lower density than an aluminum alloy). The choice of these materials for making the frame is a matter of layout, mechanical strength, mass and cost.

The basic version of the frame therefore is especially simple and provides a great modularity as will be seen subsequently.

In fact, the various elements with which the frame is going to be equipped may be configured as desired, without questioning the design of the frame.

There now is going to be described, in relation to FIGS. 1 to 3, an element called interfacing block, shown with the reference 50, and with which frame 10 is equipped so as to be able to accommodate an electronic module, or even several electronic modules according to the invention. An electronic module or equipment item generally comprises one or more electronic cards disposed inside a casing/covering or a protective enclosure and which comprises one or more mechanical fastening interfaces and possibly an electrical connection interface.

Such a module may be used as a computer dedicated, for example, to a specific function (for example a flight control computer) or as a resource.

As a resource, such a module may constitute a component of a computer or a component serving several computers.

More particularly, the electronic card or cards may comprise different functionalities: supply, computation (CPU), inputs/outputs, bus management, memories, specific peripherals such as rategyro, gyroscope, hard disk.

An electronic module according to the invention is a unitarily replaceable element.

Interfacing block 50 is intended to be interposed between the frame and an electronic module or else several electronic modules intended to be fastened and connected electrically thereto.

It will be noted in this regard that electrical connection elements not shown are provided. In the example illustrated on the Figures where the frame is installed in an aircraft, these elements are cable bundles of the aircraft equipped with electrical connectors.

Interfacing block 50 has (FIGS. 2 and 3) a thick central part 52 from which thin edges or flanks 54 and 56 extend in two opposite directions.

Block 50 is installed on the vertical front wall of the frame, and more particularly on two consecutive transverse jambs 16 and 18, so that thick central part 52 at least partially enters the interior of the space or groove 24 and the thinned-down edges or flanks 54 and 56 are positioned against jambs 16 and 18.

Interfacing block 50 arranged in this way reveals facing the outside a vertical front surface 50a on which one or more electronic modules according to the invention are going to come to be positioned.

Thinned-down edges or flanks 54 and 56 of block 50 are fastened respectively to jambs 16 and 18 via standard mechanical holding means such as screws, rivets, bolts, soldering, or by non-removable means such as by welding, bonding. It will be noted that frame 10 constitutes the infrastructure on which a plurality of interfacing blocks similar to block 50 are going to be fastened. These blocks comprise all the interfacing elements necessary for accommodating the electronic modules according to the invention.

The use of interfacing blocks considerably simplifies the positioning and fastening of the electronic modules/equipment items on the frame. Moreover, an interfacing block has a small size in comparison with the fastening systems and the various interfaces used in the prior art.

In the exemplary embodiment illustrated on FIGS. 1 to 3, the interfacing block 50 comprises:
  a mechanical interface for attachment of one or more electronic modules along front surface 50a of the block,
  an electrical connection interface so as to establish an electrical connection with the aforesaid electronic module or modules,
  an air-conditioning interface to allow circulation of a fluid, for example coolant, between the frame and the electronic module or modules concerned (in other exemplary embodiments the fluid may be used to heat a module).

It will be noted that the interface for attaching an electronic module is configured so that the said module is attached by being suspended from the vertical interfacing block where, ordinarily, the electronic modules rest on horizontal supports and are flanked by two side partitions/jambs. On the Figures, the attachment interfaces are situated at the back of the electronic module, but in an alternative embodiment (not shown), they are situated on the sides of the electronic module. Central part 52 of the interfacing block comprises one or more electrical connection interfaces, for example of the piston-contact type such as shown on FIGS. 4a and 4b.

FIG. 4 schematically illustrates the principle of establishing an electrical connection via piston contacts.

As shown on FIG. 4a, such a particularly simple connection system comprises a female part 62 comprising metallized, for example gilded, zones, on a printed circuit and a male part 64 comprising a plurality of piston contacts 66. These contacts are intended to make contact with metallized zones of a printed circuit 68 when female part 62 comes into contact with the male part 64 and presses on the contacts projecting therefrom.

Several types of male piston contacts 66a, 66b, 66c and 66d produced in two parts, namely a movable part (called the piston) which is connected to the other fixed part of the male contact with a spring, have been shown on FIG. 4b.

A crimping flange or a sleeve furthermore is provided for crimping the male contact on a cable bundle (wiring) of the aircraft.

At the time of contact between the female part and the male part, the piston of the male contact part compresses the spring and makes contact with the fixed part of the male contact, thus establishing the desired electrical connection.

It will be noted that in the example shown on FIGS. 1 to 3, part 52 of the block comprises, for example, the male electrical contacts that are more complex to produce than the female contacts, while the electronic module that will be described subsequently comprises the provided part of the female contacts.

This arrangement makes it possible to simplify the structure of the modules or of the interfacing blocks of the modules.

The reverse arrangement (male contacts on the module and female contacts on the interfacing block linked to the frame) also is conceivable and makes it possible to protect the male contacts from external stresses more easily.

In this way, when the module is attached in suspended position along interfacing block 52, the male and female contacts of the piston contact assembly make contact with one another and thus establish an electrical connection between the electronic module and the wiring of the aircraft, not shown on the Figures.

As shown on FIGS. 1 and 3, a system for cooling the electronic module or modules intended to be connected to interfacing block 50 is provided.

In the example described, it is considered that a module 80 is connected to block 50 (multifunction interface).

This system comprises transverse boxes arranged in the frame, such as boxes 30 and 32 on FIG. 3, and which define channels for circulation of the coolant.

In the exemplary embodiment this coolant is air.

As shown on FIG. 3, box 32 forms a unit for injection of coolant into the electronic module as illustrated by the arrows marked with the reference I (ventilation or blowing of cool air), while box 30 constitutes a unit for suction of the fluid having served to cool the electronic module as illustrated by the arrows referenced A (suction or evacuation of warm air).

As shown on FIG. 1, the boxes have an opening in the form of a rectangular slot 30a, 32a, 34a, 36a, 38a and 40a which extends along more or less the entire width of the frame.

Interfacing block 50 which is fastened against the transverse jambs of the frame comes to close off the slot in places over the entire width of the block (see slots 30a and 32a on FIG. 3) and comprises orifices traversing the edges or flanks of the block in the portions thereof that are situated facing the open slot of the box.

More particularly, as shown in cross section on FIG. 3, a duct extends on both sides of each edge of the interfacing block so as to channel the flow of fluid traversing the said block.

In this way, edge 56 of the block comprises a duct 55 traversing the said edge in its thickness and allowing the coolant to pass from channel 44 to electronic module 80, while edge 54 of the block comprises a duct 57 allowing the coolant having circulated in the electronic module and having fulfilled its cooling function to be evacuated in channel 42.

It will be noted that each of ducts 55 and 57 has an open end that projects inside each of channels/boxes 44 and 42.

Interfacing block 50 also comprises, in a manner not shown on FIG. 3, but shown on FIG. 2, two other ducts 59 and 61 situated in the background of respective ducts 55 and 57 and set apart therefrom.

It will be noted that the number of ducts of the interfacing block depends on the width of same, as well as on the needs for heat dissipation.

According to a variant not shown, the air-conditioning system comprises a unit for injection of a fluid, which is air for example, into the electronic module, for example to cool it, and the module includes openings/orifices, customary or otherwise, for evacuating the warm air. In this case, there is no unit for suction or evacuation of warm air in the frame.

Electronic module 80 shown on FIG. 3 comprises a front module part 80*a* which is provided with a complementary electrical connection interface allowing it to cooperate with the electrical connection interface present in part 52 of interfacing block 50. The module also comprises a complementary cooling interface for cooperating with each injection 44 and suction 42 unit of the cooling system.

This module part 80*a* dedicated to these interfaces may be an integral part of the module or be part of a separate interfacing block 82 as illustrated on FIG. 5.

The module is, for example, screwed to block 82 on its periphery.

This block 82 has a more or less parallelepipedal shape comprising a central part 84 which is situated facing central part 52 of block 50 on FIG. 3 and which comprises the electrical connection interface complementary to that of part 52.

Interfacing block 82 also comprises, on both sides of central part 84, two portions each comprising ducts a projecting end of which opens out in relation to front part 80*a* and cooperates with the opening ends facing ducts 55 and 57 of interfacing block 50 (FIG. 3).

Block 82 thus comprises, in upper position, two ducts 85 and 86 set apart from one another and, in lower position, two ducts 87 and 88 with the same spacing, this spacing corresponding to that of the ducts arranged on interfacing block 50.

It will be noted that ducts 87 and 88 make it possible to conduct the coolant inside electronic module 80, while ducts 85 and 86 make it possible to evacuate, by suction, the fluid having served to cool the module.

When the fluid of the air-conditioning system is a liquid, the fluid conduction and fluid evacuation ducts of interfacing block 50 and interfacing block 82 (for example ducts 55 and 88) are each equipped with a rapid connection and disconnection fluidic connector. These connectors are, for example, soldered or screwed onto the ducts with a male part on one side and a female part on the other.

Such a type of fluidic connector (not shown on the Figures) is, for example, marketed by the company STAUBLI.

It will be noted that because of the attachment of the module by suspension, the latter is held in contact against the surface of the interfacing block by the action of the weight of the module.

The weight of the module combined with the method of fastening the module on the frame contributes markedly to the imperviousness of the fluidic connection at the conduction or evacuation ducts.

Moreover, a sealing joint (not shown on the Figures) is disposed between the interfacing blocks and, more particularly, between the two side walls facing adjacent blocks taken two by two. The joint is, for example, fastened to one of the side walls and is of the "point" joint type.

FIG. 6 illustrates frame 10 of FIG. 1 on which several frame interfacing blocks 50, 91, 92, 94, 96 and 98 are fastened. Blocks 91 and following comprise the same characteristics as those of block 50.

The front surfaces of all the blocks all are situated in the same vertical plane which serves as a common reference and interfacing plane for all the modules to be interfaced with these blocks.

As shown on FIG. 6, the interfacing blocks have different widths and the number of ducts/orifices for connection to the cooling system varies according to these widths.

In general, the number of ducts increases with the width of the block inasmuch as the latter is linked to the width of the electronic module or modules that are going to be interfaced with the block and therefore is linked to heat dissipation needs.

Thus there are interfacing blocks comprising a single duct for conduction and a single duct for evacuation of fluid and blocks which comprise three of each type.

The number of ducts/orifices, however, may be greater than that shown on FIG. 6.

As shown on the Figures, the assembly for fastening and electrical connection according to the invention comprises, in its minimal configuration, a frame such as frame 10 of FIG. 3 and an electronic module 80, the latter being attached to the said frame.

More particularly, electronic module 80 is attached to interfacing block 50 which itself is fastened to frame 10 (FIG. 3).

The module is attached to the interfacing block through a link articulated, for example, around a pivot link.

The attachment system of the module is provided in two parts, one adjoining the module and the other the interfacing block.

More particularly, the front face of front part 80*a* of the module extends between two opposite ends 80*b* and 80*c* which define a dimension corresponding to the height of the module when the latter is arranged against the vertical frame.

It will be noted that the module comprises an opposite face referred to as rear face 80*d* which extends between two opposite ends along the height, 80*e* and 80*f*, the height of the rear face being below that of the front face.

Moreover, the dimension (depth) of the module between two opposite faces 80*a* and 80*d* which extends over a perpendicular to front surface 50*a* of the interfacing block generally is less than the maximal height of the block, or even the minimal height.

This condition ensures a stable mechanical holding of the module in suspended position.

By way of example, the maximal height of the module is 329 mm, the minimal height is 282 mm and the depth is 222 mm.

The dimensions of the module have been chosen, for example, so as to integrate into this module one or more electronic cards of standardized 6U size and 169 mm in length (depth).

The part of the attachment system of the module is disposed in the vicinity of upper end 80*b* and the complementary part of the block is disposed at the upper end of interfacing block 50, at edge 54 and beyond duct 57.

As shown on FIGS. 1, 2, 3 and 5, the attachment system comprises, on the module, for example, at least one element forming pivot 90 and, on the front surface of the interfacing block, one or more elements for accommodating and retaining the element forming a pivot and, for example, one or more hooks curved toward the front surface of block 50.

For example, as shown on FIGS. 1, 2 and 5, the element forming pivot 90 takes on the shape of a bar parallel to the width of the module and which here is disposed horizontally, while two hooks 92*a* and 92*b* are fastened on surface 50*a*.

According to a variant, element 90 may be made up of two bars forming pivots, set apart from one another and disposed facing two accommodation and retention components 92a and 92b.

According to another variant, the interfacing block or the module comprises a single hook that is intended for cooperating with a sole bar 90.

It will be noted that the number of fastening elements may vary according to the width of the interfacing block of the module and thus may be reduced to one when this width is reduced, as for blocks 92 and 96 of FIG. 6.

When the width of the interfacing block increases, however, as is the case for blocks 91 and 98 of FIG. 6, the number of fastening elements does not vary, only the spacing between the latter increases.

If the width of the interfacing blocks increases significantly, however, it is conceivable to add one or more further fastening components for reasons of mechanical strength in relation to the load that is to be supported.

It furthermore will be noted that the attachment system that has just been described may be reversed in the sense that the element forming pivot 90 is arranged on interfacing block 50, while the retention component or components are arranged on the module.

It will be noted that other attachment systems may be used for suspending the module from the interfacing block (vertical interface). FIG. 7 illustrates the activity necessary for installation of an electronic module on the frame.

In order to install the electronic module, it is necessary to bring same to the vicinity of the appropriate interfacing block by positioning the attachment component of the module slightly above the complementary attachment component of the said interfacing block, in the slightly tilted position illustrated in dotted lines on FIG. 7. The module then is lowered so as engage the attachment component of the module with the complementary attachment component of the block to form the articulation and then pivot the module so as to take up the position illustrated in solid lines on FIG. 7. The pivot at the upper part of the module ensures a precise guidance of the module at the time of its rotation in relation to the frame.

Furthermore, the pivot link between the module and the block ensures the horizontal and vertical positioning of the module without resorting to three separate planes as in the prior art.

Figure 8:
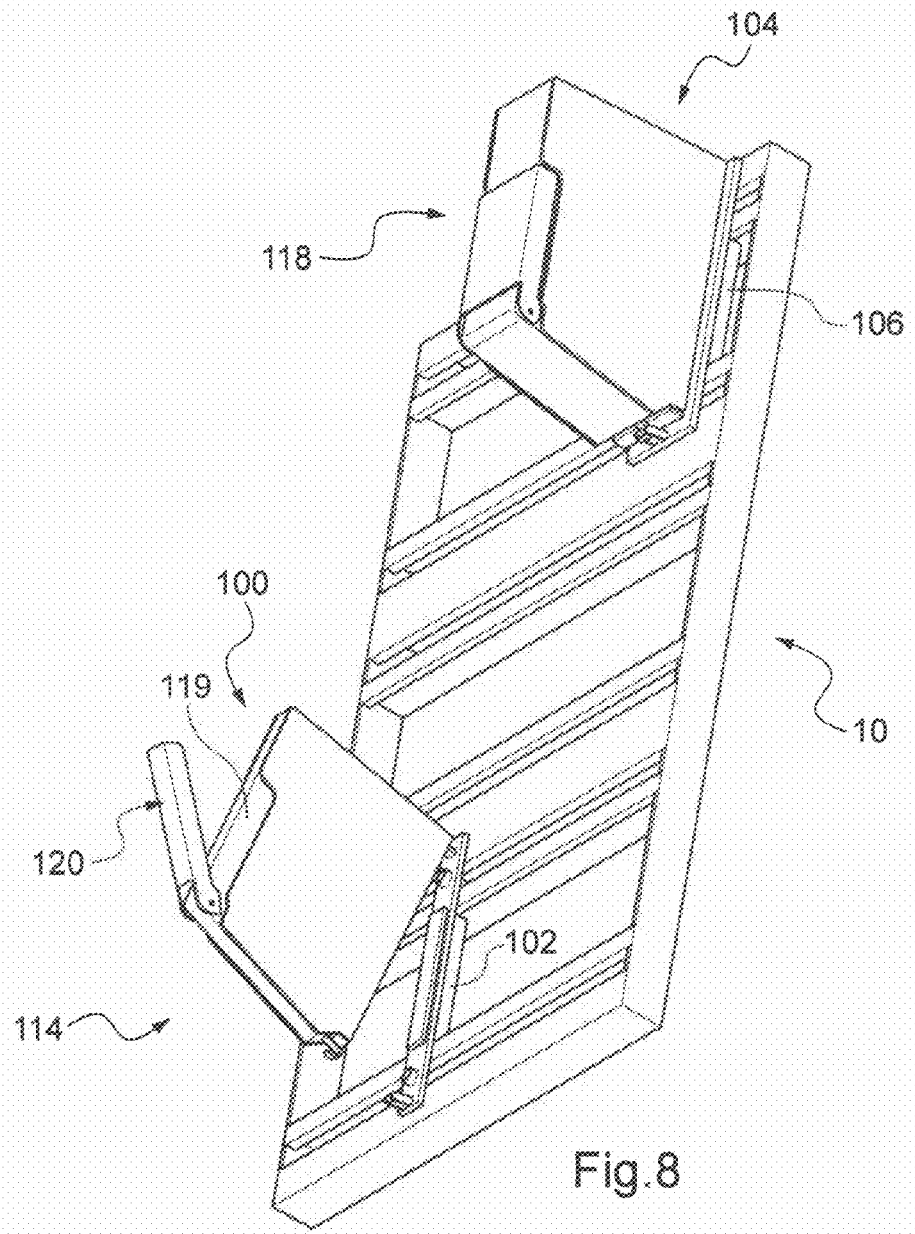
FIG. 8 illustrates, according to a perspective view from below, the installation of an electronic module on a frame according to the invention.

FIG. 8 illustrates, according to a perspective view from below, the installation of an electronic module 100 on an interfacing block 102 already fastened to frame 10.

There also has been shown on this Figure a module 104 wider than module 100 and already installed in position on its corresponding interfacing block 106.

Thus attached, the electronic module is suspended from the corresponding interfacing block and the front surface of the module is in contact with front surface 50a of the interfacing block so as to ensure cooperation of the electrical and thermal connection interfaces respectively.

In this way, the new fastening and connection assembly according to the invention makes it possible to fasten and connect an electronic module to an existing electrical installation and, for example, to an aircraft wiring, more easily than before.

The assembly occupies a relatively small space requirement in comparison with the state of the art and holding the electronic modules fastened to the frame is simplified.

It will be noted that the thickness or the depth (dimension along the X axis on FIG. 3) of a unit of the state of the art is, for example, on the order of 400 mm, while that of the assembly according to the invention is on the order of 300 mm.

The implementation of an interfacing block comprising several different types of interface, for example two or three types (electrical, mechanical and thermal) and therefore providing several functions has numerous advantages, namely:
- decrease in the number of parts of the assembly and therefore reduction of the on-board mass, ease of assembly, reduction of costs . . . ;
- concentration of complex functions on a single part and, therefore, the adjacent parts (frame, module covering . . . ) may be optimized (simpler, lighter in weight, less costly to manufacture . . . );
- possibility of standardization of a complex part.

Furthermore, means for locking the module in its suspended position are provided.

These locking means are made up of two parts, one part adjoining the interfacing block and the other part adjoining the corresponding module.

As shown on FIG. 3, the locking means of the interfacing block are arranged on the lower part thereof (on edge 56) and the locking means of the module are arranged near lower end 80c.

The locking means comprise, for example, a hook 110 linked to module 80 and which cooperates with a retaining component 112 integral with front surface 50a of the interfacing block (FIGS. 2 and 3).

Retaining component 112 is, for example, made in the form of two arms 112a, 112b extending from edge 56 of the block and the free ends of which are connected to one another by a rod 112c perpendicular to the arms (FIG. 2).

It will be noted that block 82 of FIG. 5 provides a clearance 89 for passage of the hook.

This locking of the module in suspended position makes it possible to be certain that the latter will not move away from the frame as a result of untimely movements or vibrations and that in this way the electrical connection, just as the circulation of the coolant, will not be interrupted.

It will be noted that the locking means comprises a rod 114 arranged underneath the module and which makes it possible to actuate the deployment or the retraction of the hook, thus functioning as a trigger by virtue of the actuation of an actuation arm or lever 116 which constitutes a grasping component (handle) for a user. The trigger actuation mechanism for the hook is known in itself and therefore will not be described further.

The companies SOUTCHO and PINET supply trigger locking systems. It will be noted that such systems moreover may comprise additional functionalities of the play take-up and/or retaining stress management, electrical . . . type.

This grasping component 116 is connected to the locking means described above and may be actuated between a first locked position in which the component is disposed folded back against the module, as shown in solid lines on FIG. 3 (see also handle 118 in folded-back position on FIG. 8), and a deployed position in which the component is moved away from the module (see also handle 120 on FIG. 8).

In the first position 116(a) where the component is folded back against the module by virtue of an appropriate cut-out therein, hook 110 of the trigger mechanism cooperates with retaining component 112, thus locking the module in position.

It will be noted that component 116 has a general longitudinal shape and a cross section for example U-shaped, the inside of which is facing the module and the spacing of which between the arms of the U is slightly less than the width of the module. Two grooves, one of which referenced 117 is shown on one of the outside walls of the module (FIG. 3), the other being symmetrical and laid out on the outside wall opposite the module (groove 119 of module 100 of FIG. 8), are provided for accommodating the arms of the U-shaped section of the component in stowage position 116(a).

In position 116(b) shown on FIG. 3 where the actuation component is moved away from the module, rod 114 for actuating the hook pulls on the latter which then is disengaged from retaining component 112 and thus releases the module from its locked position.

It will be noted that when actuation component 116 on FIG. 3 or 120 on FIG. 8 is moved away along a direction perpendicular to the front surface of the interfacing block, then the component in this position serves as a visual signal for an observer who knows that the module is in unlocked position. In this way the observer is informed that the module is not correctly positioned and that its proper functioning is not ensured.

Appropriate measures then should be taken either to put it back in locked position or to remove it from its place.

A view in cross section of a fastening and electrical connection assembly according to the invention has been shown on FIG. 9.

This assembly comprises a frame 200 which forms a structure similar to frame 10 of the preceding Figures (this structure resembles a panel) and onto which are added, in suspended manner, several electronic modules only some of which are shown, namely, modules 210, 220, 240 and 250 which are disposed one above the other.

It will be noted that in order to arrange four modules one above the other, frame 200 comprises an additional transverse jamb in comparison with frame 10 of FIG. 1.

The internal structure of the frame is identical to that illustrated and described with reference to the preceding Figures and interfacing blocks 211, 221, 241 and 251 identical to block 50 of FIG. 3 are fastened to the front face of the frame to allow mechanical and electrical interfacing of the electronic modules on a vertical interface.

Module 220 has been shown in slightly tilted position so as to illustrate the position adopted at the time of installation or removal of a module with actuation component 231 moved away.

The modules which are seen in cross section have an identical shape but their width may differ as illustrated on FIG. 10.

Module 220 comprises a front face 220a and an opposite rear face 220b, the front face being intended to make contact with the front surface of interfacing block 221 facing one another.

Module 220 also comprises two faces, upper and lower, respectively marked 220c and 220d, which each form a slope for connecting the front face to the rear face inasmuch as the dimension of the latter is smaller than the dimension of the front face.

This slight slope on the order of a few degrees allows the module to be pivoted upward around its upper pivot pin without running the risk of being hindered in this movement by the module situated above (module 210 on FIG. 9).

It furthermore will be noted that the dimension of the electronic modules along the X axis, that is to say in a direction perpendicular to the front surface of the interfacing blocks, surface including the Z axis (this dimension corresponds to the thickness or to the depth of the module), is less than the dimension of the module along the Z axis when the module is disposed vertically as on FIG. 9 (this dimension is called height of the module).

This dimensional relationship ensures the holding of the modules in suspended position on the frame in stable manner, without there being any risk of exercising an excessively high force couple on the frame because of an excessively large lever arm.

As briefly mentioned above, FIG. 10 illustrates, in a front view, frame 200 on which a plurality of electronic modules of variable widths are installed, distributed one above the other along several rows. The assembly for fastening and connection of electronic modules according to the invention comprises a first upper row of electronic modules 210, 212, 214, 215, 216, 217, 218 and 219 having variable widths.

The assembly also comprises a row immediately below comprising electronic modules 220, 222, 224 and 226.

On a still lower row, the assembly comprises electronic modules 240, 242, 243, 244, 245 and 246.

Finally, on the lowest row the assembly comprises electronic module 250, a plurality of electronic modules of small width grouped together under reference 252 and electronic modules of greater width 254 and 256, as well as a last electronic module 258 of small width.

In order to allow fastening and electrical connection of these modules in the same vertical plane, the frame is equipped beforehand with interfacing blocks situated at different vertical heights and, for the same height, at different spatial positions along the Y axis. Each of these blocks comprises a module attachment system and an electrical connection interface.

Furthermore, the assembly of FIG. 10 also comprises on the three first rows starting from the top, elements referenced 260, 262 and 264 of variable width and which constitute seals so as to close off the unused places on the frame.

By way of example, these seals are fastened directly to the frame and have as a function in particular to imperviously close off the slot of each of the ventilation and suction boxes opposite which they are disposed.

These sealing elements may take the form of more or less planar blocks/plates.

Alternatively, the sealing elements may be fastened directly (for example by clipping) to the interfacing blocks of the frame, on the orifices of the open ducts for conduction and evacuation of fluid, in the manner of protective covers or caps (made of plastic, for example).

Figure 11:
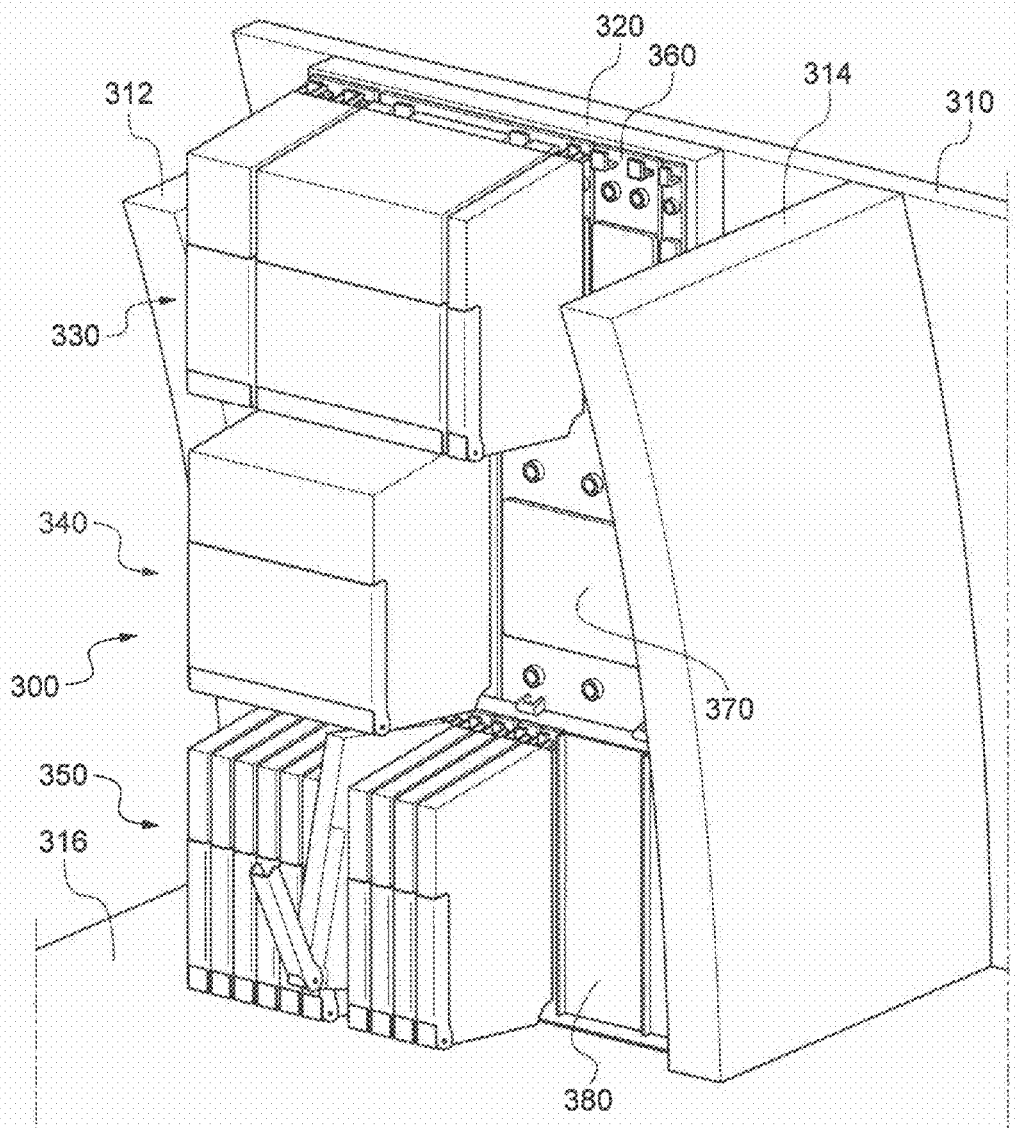
FIG. 11 is a schematic representation of a modular assembly according to the invention set up in an aircraft.

Set-up in an aircraft of a modular assembly 300 according to the invention has been shown on FIG. 11.

This assembly is disposed against a structure 310 of the aircraft (side wall) between two vertical walls 312 and 314, integral with structure 310 and which extend perpendicular from the latter toward the inside of the aircraft.

The assembly comprises a frame 320 similar to the frame described above, and which is disposed against wall 310 of the aircraft.

This frame is, for example, fastened against this wall, for example via rods which provide an optimal position adjustment while compensating for the circular shape of the aircraft cabin. Just like the assemblies described above, frame 320 is equipped with a plurality of interfacing blocks each comprising mechanical interfaces for attachment of electronic modules, electrical connection interfaces for electrical connection with the modules and thermal interfaces for cooling the modules.

Assembly 300 thus comprises a plurality of electronic modules arranged horizontally and vertically along several rows disposed one above the other, each horizontal row comprising several modules disposed one next to the other.

Three rows are differentiated here, each row comprising a plurality of electronic modules shown by the reference 330 for the first upper row, 340 for the second row immediately below and 350 for the lowest row, close to floor 316.

It will be noted that on the lowest row, one of the electronic modules is in pivoted position which corresponds to an installation or a removal, the actuating handle of the module being moved away from the latter.

A sufficient vertical clearance is provided between lowest modules 350 and floor 316 in order to allow their installation and their removal by pivoting.

It will be noted moreover that on the two highest rows two interfacing blocks 360 and 370 respectively are fastened to the frame in anticipation of accommodating an electronic module on each of them.

Moreover, on the lowest last row, the assembly also comprises a sealing element 380 disposed next to the electronic modules.

This element, of course, is removable and may be replaced by an interfacing block when the assembly is to be equipped with additional electronic modules. According to a variant, such an element may be fastened to an interfacing block in the manner of a protective cover.

It thus is noted that the fastening and connection assemblies according to the invention provide a particularly advantageous modularity as well as considerable ergonomics, for installation as well as for removal of the electronic modules and the interfacing blocks.

In a manner not shown, the frame is connected at the back to the wiring of the aircraft, more particularly the central parts of the interfacing blocks where the electrical connecting interfaces are situated are connected to a plurality of cable bundles equipped with connectors through appropriate electrical connection means of the interfacing blocks.

It will be noted moreover that frame 320, and more particularly the boxes of the cooling system, also are connected to an existing cooling/ventilation circuit on board the aircraft.

The invention claimed is:

1. A modular assembly comprising:
   a frame having a front surface;
   an interfacing block including a mechanical fastening interface, the interfacing block attached at opposite ends thereof to the front surface of the frame; and
   at least one electronic module including a mechanical fastening interface, the at least one electronic module being attached to the front surface of the frame in a suspended position such that the mechanical fastening interface of the at least one electronic module engages with the mechanical fastening interface of the interfacing block on the frame,
   wherein the frame includes
      first and second longitudinal jambs extending in a first direction, and
      first and second lateral jambs, each lateral jamb having respective first ends thereof connected to the first longitudinal jamb and having respective second ends thereof connected to the second longitudinal jamb, the first and second lateral jambs extending between the first and second longitudinal jambs in a second direction that is transverse to the first direction, and
   wherein the interfacing block is attached at opposite ends thereof to the first and second lateral jambs, respectively.

2. The modular assembly according to claim 1, wherein the at least one electronic module further includes an electrical connection interface, and
   wherein the interfacing block further includes an electrical connection interface that establishes an electrical connection with the electrical connection interface of the at least one electronic module.

3. The modular assembly according to claim 1 further comprising locking means for locking the module in the suspended position.

4. The modular assembly according to claim 3, wherein the at least one electronic module further includes an actuation component connected to the locking means, the actuation component being actuable between a locked position in which the actuation component is disposed against the at least one electronic module and an unlocked position in which the actuation component is moved away from the at least one electronic module.

5. The modular assembly according to claim 1, wherein the at least one electronic module is attached to the front surface of the frame via an attachment system including an articulated link.

6. The modular assembly according to claim 1, further comprising an air-conditioning system to cool the at least one electronic module.

7. The modular assembly according to claim 6, wherein the air-conditioning system is fastened to the frame, the air-conditioning system including
   a fluid injection unit via which a fluid is injected into the at least one electronic module, and
   at least one of
      a fluid suction unit via which the fluid is suctioned from the at least one electronic module,
      a plurality of openings in the at least one electronic module for evacuation of the injected fluid, and
   wherein the at least one electronic module further includes a complementary interface for cooperating with the fluid injection unit.

8. The modular assembly according to claim 1, further comprising a plurality of interfacing blocks which are arranged-horizontally so as to suspend a corresponding number of electronic modules adjacent to each other according to a horizontal arrangement forming a row, and the plurality of interfacing blocks being further arranged at different vertical heights so as to suspend several rows of electronic modules vertically with respect to each other.

9. A frame for fastening electronic modules carried on board an aircraft, comprising:
   a front surface;
   a plurality of interfacing blocks, each interfacing block being attached at opposite ends thereof to the front surface, each interfacing block respectively including a mechanical fastening interface disposed outwardly with respect to the front surface, and each interfacing block being configured to secure, in a suspended position, an electronic module carried on board the aircraft;
   first and second longitudinal jambs extending in a first direction; and
   first and second lateral jambs, each lateral jamb having respective first ends thereof connected to the first longitudinal jamb and having respective second ends thereof connected to the second longitudinal jamb, the first and second lateral jambs extending between the first and second longitudinal jambs in a second direction that is transverse to the first direction,
   wherein at least one of the interfacing blocks is attached at opposite ends thereof to the first and second lateral jambs, respectively.

10. The frame according to claim 9, further comprising an air-conditioning system for cooling the electronic module, the air-conditioning system including a fluid injection unit via which a fluid is injected into the at least one electronic module.

11. The frame according to claim 9, wherein each interfacing block respectively further including an electrical connection interface for establishing an electrical connection with the respective electronic module to which the interfacing block is attached.

12. The frame according to claim 11, wherein the electronic module comprises a mechanical fastening interface complementary to the mechanical fastening interface of the interfacing blocks.

13. The frame according to claim 12, wherein the electronic module further comprises an electrical connection interface complementary to the electrical connection interfaces of the frame to establish an electrical connection.

14. An aircraft, comprising;
a modular assembly according to claim 1.

15. An aircraft, comprising:
a frame according to claim 9.

16. The frame according to claim 10, wherein the air-conditioning system further includes a fluid suction unit via which the fluid is suctioned from the at least one electronic module.

* * * * *